(12) United States Patent
Huang et al.

(10) Patent No.: US 10,920,008 B2
(45) Date of Patent: Feb. 16, 2021

(54) THERMAL-CURABLE RESIN COMPOSITION, AND PRE-PREG, METAL-CLAD LAMINATE AND PRINTED CIRCUIT BOARD MANUFACTURED USING THE SAME

(71) Applicant: TAIWAN UNION TECHNOLOGY CORPORATION, Chupei (TW)

(72) Inventors: Ju-Ming Huang, Chupei (TW); Chen-Hua Yu, Chupei (TW); Chang-Chien Yang, Chupei (TW); Guan-Syun Tseng, Chupei (TW); Chih-Wei Liao, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 0 days.

(21) Appl. No.: 16/250,422

(22) Filed: Jan. 17, 2019

(65) Prior Publication Data
US 2020/0123307 A1    Apr. 23, 2020

(30) Foreign Application Priority Data

Oct. 23, 2018   (TW) ............................. 107137409 A

(51) Int. Cl.
| | |
|---|---|
| *C08G 59/06* | (2006.01) |
| *C08G 59/30* | (2006.01) |
| *C08G 59/26* | (2006.01) |
| *C08G 59/28* | (2006.01) |
| *C08K 5/00* | (2006.01) |
| *C08K 5/5397* | (2006.01) |
| *C08J 5/24* | (2006.01) |
| *H05K 3/00* | (2006.01) |
| *C08K 5/5399* | (2006.01) |
| *C08K 3/013* | (2018.01) |

(52) U.S. Cl.
CPC ............ *C08G 59/06* (2013.01); *C08G 59/26* (2013.01); *C08G 59/28* (2013.01); *C08G 59/308* (2013.01); *C08J 5/24* (2013.01); *C08K 5/0066* (2013.01); *C08K 5/5397* (2013.01); *C08K 5/5399* (2013.01); *H05K 3/0064* (2013.01); *C08K 3/013* (2018.01); *H05K 2203/06* (2013.01)

(58) Field of Classification Search
CPC .................................................... C08G 59/06
See application file for complete search history.

(56) References Cited

U.S. PATENT DOCUMENTS

| | | | | |
|---|---|---|---|---|
| 4,496,695 A | * | 1/1985 | Sugio | C08K 5/00 525/391 |
| 4,774,282 A | * | 9/1988 | Qureshi | C08G 73/0638 524/606 |
| 4,861,823 A | * | 8/1989 | Qureshi | C08G 73/0638 524/606 |
| 5,385,989 A | * | 1/1995 | Ohya | C08G 8/28 525/423 |
| 5,670,231 A | * | 9/1997 | Ohya | C08G 59/08 428/297.4 |
| 6,172,139 B1 | | 1/2001 | Swei et al. | |
| 2001/0020071 A1 | * | 9/2001 | Capote | C08G 59/226 525/524 |
| 2003/0003305 A1 | * | 1/2003 | Japp | B32B 15/08 428/413 |
| 2009/0203279 A1 | * | 8/2009 | Mori | C08G 65/44 442/233 |
| 2011/0037028 A1 | * | 2/2011 | Valette | C08G 18/003 252/500 |
| 2011/0247756 A1 | * | 10/2011 | Wilson | C08G 59/4014 156/307.7 |
| 2012/0097437 A1 | | 4/2012 | Liao et al. | |
| 2013/0005857 A1 | * | 1/2013 | Vyakaranam | C08G 59/4014 523/451 |
| 2013/0273796 A1 | * | 10/2013 | Su | C08J 5/24 442/59 |
| 2014/0227531 A1 | * | 8/2014 | Ogashiwa | B32B 15/20 428/418 |
| 2014/0227924 A1 | * | 8/2014 | Nobukuni | H05K 1/0353 442/60 |

FOREIGN PATENT DOCUMENTS

| | | |
|---|---|---|
| TW | 201313081 A1 | 3/2013 |
| TW | I452064 B | 9/2014 |

OTHER PUBLICATIONS

Taiwanese Office Action dated Feb. 12, 2020.

* cited by examiner

*Primary Examiner* — Megan McCulley
(74) *Attorney, Agent, or Firm* — Michael W. Ferrell; Ferrells, PLLC; Anna Kinney

(57) ABSTRACT

A thermal-curable resin composition is provided. The thermal-curable resin composition comprises:
(A) a thermal-curable resin component, which comprises:
   (a1) bismaleimide resin;
   (a2) cyanate ester resin; and
   (a3) epoxy resin,
   wherein the cyanate ester resin (a2) and the epoxy resin (a3) are respectively in an amount ranging from 50 parts by weight to 150 parts by weight and from 24 parts by weight to 51 parts by weight per 100 parts by weight of the bismaleimide resin (a1); and
(B) a filler,
wherein the filler (B) is in an amount ranging from 40 parts by weight to 55 parts by weight per 100 parts by weight of the dry weight of the resin composition; and
wherein the resin composition has a dynamic viscosity of not higher than 800 Pa·s after being brought into a semi-cured state (B-stage), and the resin composition has a dissipation factor (Df) of not higher than 0.006 at 10 GHz after being cured completely.

16 Claims, No Drawings

THERMAL-CURABLE RESIN COMPOSITION, AND PRE-PREG, METAL-CLAD LAMINATE AND PRINTED CIRCUIT BOARD MANUFACTURED USING THE SAME

CLAIM FOR PRIORITY

This application claims the benefit of Taiwan Patent Application No. 107137409 filed on Oct. 23, 2018, the subject matters of which are incorporated herein in their entirety by reference.

BACKGROUND OF THE INVENTION

Field of the Invention

The present invention provides a thermal-curable resin composition, especially a thermal-curable resin composition with high filler loading of electronic materials, with the following advantages: a low dissipation factor (Df), low dynamic viscosity and high dimensional stability. The thermal-curable resin composition of the present invention can be used in combination with glass fibers to constitute a composite material or prepreg. Furthermore, it can be used as a metal foil adhesive to prepare a laminate, a printed circuit board and an integrated circuit-carrying (IC-carrying) substrate.

Descriptions of the Related Art

In the field of electronic telecommunications, electronic products are designed to operate in ever higher frequency regions due to the increasing amount of data transmission and as a result, the requirements for the dielectric properties (i.e. lower Dk and Df) of the related electronic materials must increase. In addition, the soldering temperature for printed circuit boards has become higher due to the utilization of the lead-free process, which in turn requires the heat resistance of the dielectric layer material of the metal-clad laminates for the printed circuit boards to be greater.

Further, a multi-layer board such as a multi-layer printed circuit board or a multi-layer IC substrate is required to have a higher dimensional stability, and generally, the coefficient of the thermal expansion (CTE) of the prepared electronic material is reduced by adding a large amount of filler to the resin composition, for example, at least 40 wt % or more based on the total weight of the resin composition, to meet the dimensional stability requirements. However, when the resin composition contains a large amount of filler, the viscosity thereof increases substantially, causing not only the deterioration of the wetting factor of the resin composition with respect to the reinforcing material in the preparation of the prepreg, but also difficulty in getting the resin composition to effectively encapsulate the wiring on an inner-layer board, also referred to as a core board, in the build-up layer step of a multi-layer board, thereby causing various problems such as the formation of voids, delamination in the multi-layer board, and so on, which decreases the reliability of the electronic material.

U.S. Pat. No. 6,172,139 BI illustrates how the problem of excessively high viscosity of a resin composition can be resolved by adding a spherical powder filler to the resin composition, and that the viscosity of a resin composition can be lowered by adding a viscosity modifier to improve operability. However, the cost of a spherical powder filler is quite high, and a viscosity modifier generally adversely affects the dielectric properties of electronic materials prepared from a resin composition.

In addition, TW 1452064 B discloses a resin composition suitable for the preparation of printed circuit boards and semiconductor substrates, wherein a thermosetting polyimide resin is used so that the prepared electronic materials have a V0 ranking for the flame retardance level without the addition of a bromine- or phosphorus-based flame retardant. However, the resin composition disclosed in TW 1452064 B contains a high proportion of epoxy resin, so that the Df value of the prepared electronic material at 10 GHz is much higher than 0.006. Furthermore, the polyimide resin does not actually provide sufficient flame retardance to the prepared electronic material, and therefore, in the examples thereof, a flame retardant such as alumina trihydrate (ATH), hydrated magnesium hydroxide, etc. is further added in the resin composition. However, both ATH and hydrated magnesium hydroxide adversely affect the dielectric properties of the prepared electronic materials.

SUMMARY OF THE INVENTION

In view of the abovementioned technical problems, the present invention provides a thermal-curable resin composition, which comprises a combination of a bismaleimide resin, a cyanate ester resin, a small amount of epoxy resin and a relatively large amount of filler in a certain ratio. The thermal-curable resin composition of the present invention has a low viscosity in the semi-cured state, so that the prepared prepreg is suitable for build-up layer usage to prepare a multi-layer board or an IC substrate. In addition, the electronic materials prepared from the thermal-curable resin composition of the present invention can have better dielectrical properties, heat resistance and dimensional stability.

Therefore, an objective of the present invention is to provide a thermal-curable resin composition, comprising:
(A) a thermal-curable resin component, which comprises:
  (a1) a bismaleimide resin;
  (a2) a cyanate ester resin; and
  (a3) an epoxy resin,
  wherein the cyanate ester resin (a2) and the epoxy resin (a3) are respectively in an amount ranging from 50 parts by weight to 150 parts by weight and from 24 parts by weight to 51 parts by weight per 100 parts by weight of the bismaleimide resin (a1); and
(B) a filler,
wherein the filler (B) is in an amount ranging from 40 parts by weight to 55 parts by weight per 100 parts by weight of the dry weight of the resin composition; and
wherein the thermal-curable resin composition has a dynamic viscosity of not higher than 800 Pa·s after being brought into a semi-cured state (B-stage), and the thermal-curable resin composition has a dissipation factor (Df) of not higher than 0.006 at 10 GHz after being cured completely.

In some embodiments of the present invention, the bismaleimide resin (a1) has a structure represented by the following formula (I):

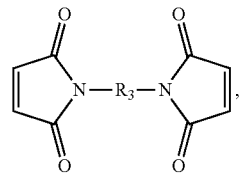

formula (I)

wherein, in formula (I), R₃ is selected from the group consisting of methylene (—CH₂—), 4,4'-diphenylmethane group

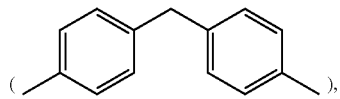

m-phenylene

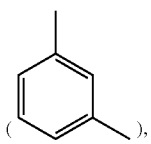

bisphenol A diphenyl ether group

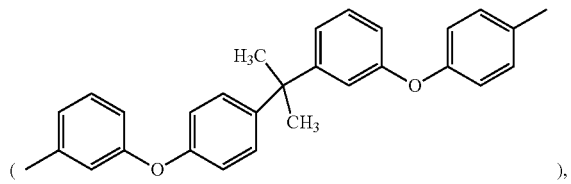

3,3'-dimethyl-5,5'-diethyl-4,4'-diphenylmethane group

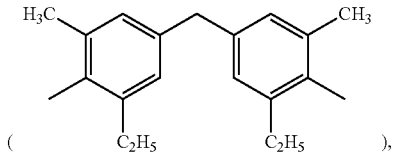

4-methyl-1,3-phenylene

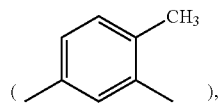

and 2,2,4-trimethyl-1,6-hexamethylene

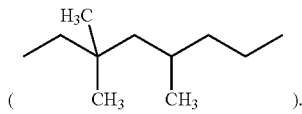

Preferably, R₃ is 3,3'-dimethyl-5,5'-diethyl-4,4'-diphenylmethane group

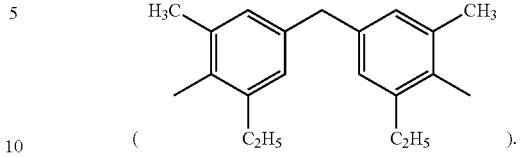

In some embodiments of the present invention, the cyanate ester resin (a2) is selected from the group consisting of 2,2-bis(4-cyanooxyphenyl)propane, 4,4'-ethylidene bis-phenylenecyanate, 4,4'-dicyanooxybiphenyl, bis(4-cyanooxy-3,5-dimethylphenyl)methane, bis(4-cyanooxyphenyl) sulfide, bis(4-cyanooxyphenyl) ether, a prepolymer of bisphenol A dicyanate ester, 1,1-bis(4-cyanooxyphenyl)ethane, 1,1-bis(4-cyanooxyphenyl)methane, 1,3-bis(4-cyanooxyphenyl-1-(methylethylidene)) benzene, bis(4-cyanooxyphenyl)-2,2-butane, 1,3-bis[2-(4-cyanooxyphenyl)propyl]benzene, tris(4-cyanooxyphenyl)ethane, cyanated phenol, an adduct of cyanated phenol dicyclopentadiene, and combinations thereof. Preferably, the cyanate ester resin (a2) is 2,2-bis(4-cyanooxyphenyl)propane.

In some embodiments of the present invention, the epoxy resin (a3) has at least two epoxy functional groups in each molecule.

In some embodiments of the present invention, the epoxy resin (a3) is selected from the group consisting of a phenol phenolic epoxy resin, a bisphenol A epoxy resin, a bisphenol F epoxy resin, a bisphenol S epoxy resin, a cresol phenolic epoxy resin, a bisphenol A phenolic epoxy resin, a bisphenol F phenolic epoxy resin, a diphenylethylene epoxy resin, a triazine skeleton-containing epoxy resin, a fluorene skeleton-containing epoxy resin, a triphenol methane epoxy resin, a biphenyl epoxy resin, a xylylene epoxy resin, a biphenyl aralkyl epoxy resin, a naphthalene epoxy resin, a dicyclopentadiene (DCPD) epoxy resin, an alicyclic epoxy resin, and combinations thereof.

In some embodiments of the present invention, the epoxy resin (a3) is selected from the group consisting of 1,4-butanediol diglycidyl ether, 1,6-hexanediol diglycidyl ether, (poly)ethylene glycol diglycidyl ether, (poly)propylene glycol diglycidyl ether, trimethylolethane triglycidyl ether, trimethylolpropane triglycidyl ether, 1,4-cyclohexane dimethanol diglycidyl ether, 1,2-epoxy-4-(epoxyethyl) cyclohexane, glycerol triglycidyl ether, diglycerol polydiglycidyl ether, 2,6-diglycidyphenyl glycidyl ether, 1,1,3-tris(4-glycidyloxyphenyl)propane, diglycidyl 1,2-cyclohexanedicarboxylate, 4,4'-methylenebis(N,N-diglycidylaniline), 3',4'-epoxycyclohexylmethyl 3,4-epoxycyclohexanecarboxylate, triglycidyl-p-aminophenol, tetraglycidyl-m-xylylenediamine, tetraglycidyldiaminodiphenylmethane, tetraglycidyl-1,3-bisaminomethylcyclohexane, bisphenol A diglycidyl ether, bisphenol S diglycidyl ether, tetrabromobisphenol A diglycidyl ether, hydrogenated bisphenol A diglycidyl ether, pentaerythritol diglycidyl ether, pentaerythritol tetraglycidyl ether, pentaerythritol polyglycidyl ether, resorcinol diglycidyl ether, diglycidyl phthalate, diglycidyl tetrahydrophthalate, neopentyl glycol diglycidyl ether, bisphenol hexafluoroacetone diglycidyl ether, triglycidyl isocyanurate, tris(3,4-epoxybutyl) isocyanurate, tris(4,5-epoxypentyl) isocyanurate, tris(5,6-epoxyhexyl) isocyanurate, tris(7,8-epoxyoctyl) isocyanurate, tris(2-glycidoxyethyl) isocyanurate, monoallyl diglycidyl isocyanurate, N,N'-diglycidyl-N"-(2,3- dipropionyloxypropyl)isocyanurate, tris(2,2-bis(glycidoxymethyl)butyl)-3.3',3"-(2,4,6-trioxo-1,3,5-triazine-1,3,5-triyl) tripropionate, sorbitol polyglycidyl ether, diglycidyl adipate, dibromophenyl glycidyl ether, 1,2,7,8-diepoxy octane, 1,6-dimethylol perfluorohexane diglycidyl ether, 4-(spiro[3,4-epoxycyclohexane-1,5'-[1.3]dioxane]-2'-yl)-1,2-epoxycyclohexane, 1,2-bis(3,4-epoxycyclohexylmethoxy)ethane, 4',5'-epoxy-2'-methylcyclohexylmethyl 4,5-epoxy-2-methylcyclohexanecarboxylate, ethylene glycol bis(3,4-epoxycyclohexane carboxylate), bis(3,4-epoxycyclohexylmethyl) adipate, bis(2,3-epoxycyclopentyl) ether, and combinations thereof.

In some embodiments of the present invention, the filler (B) is selected from the group consisting of silicon dioxide (e.g., hollow silicon dioxide), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like, graphite, calcined kaolin, pryan, mica, hydrotalcite, polytetrafluoroethylene (PTFE) powder, glass bead, ceramic whisker, carbon nanotube, nanosized inorganic powder, and combinations thereof.

In some embodiments of the present invention, the thermal-curable resin component (A) further comprises a benzoxazine resin (a4), wherein the benzoxazine resin (a4) is in an amount ranging from 3 parts by weight to 10 parts by weight per 100 parts by weight of the thermal-curable resin component (A).

In some embodiments of the present invention, the thermal-curable resin composition further comprises a phosphorus-containing flame retardant (C), wherein the phosphorus-containing flame retardant (C) is selected from the group consisting of a metal phosphinate, a diphenyl phosphine oxide (DPPO) compound, a phosphazene compound, and combinations thereof.

Another objective of the present invention is to provide a prepreg that is prepared by impregnating a substrate with the abovementioned resin composition or by coating the abovementioned resin composition onto a substrate, and drying the impregnated or coated substrate.

Yet another objective of the present invention is to provide a metal-clad laminate that is prepared by laminating the abovementioned prepreg and a metal foil, or by coating the abovementioned resin composition onto a metal foil and drying the coated metal foil.

Yet another objective of the present invention is to provide a printed circuit board that is prepared from the abovementioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification.

Unless stated otherwise, the expressions "a," "the," or the like recited in the specification (especially in the claims) should include both the singular and the plural forms.

Unless stated otherwise, while describing constituents in a solution, mixture or composition in the specification, the amount of each constituent is calculated based on the dry weight, i.e., regardless of the weight of the solvent.

As used herein, the expression "semi-cured state (B-stage)" refers to the stage at which a thermal-curable resin composition is cured by heat until the conversion ratio of the thermal-curable resin is 50±5%, wherein the conversion ratio expresses the degree of curing of the thermal-curable resin, wherein the degree of curing can be measured, for example, by a rheometer.

As used herein, the expression "cured completely" is used to indicate that a thermal-curable resin composition is completely polymerized by heat and cured into a solid state.

As used herein, the expression "resin solid content" refers to all the other solid components excluding fillers in a thermal-curable resin composition. That is, the resin solid content includes a thermal-curable resin component (A), etc. as necessary components, and optional components (for example, an additive and a phosphorus-containing flame retardant (C)).

Compared with the prior art, the distinguishing feature of the present invention lies in that a small amount of epoxy resin and a relatively large amount of filler are added into a thermal-curable resin composition containing a bismaleimide resin and a cyanate ester resin to form a thermal-curable resin composition with high filler loading, wherein an electronic material prepared from the thermal-curable resin composition can have better dielectrical properties, heat resistance and dimensional stability, and the thermal-curable resin composition can provide a suitable dynamic viscosity for the preparation of multi-layer boards. In the thermal-curable resin composition of the present invention, using an epoxy resin at the specified amount can reduce the dynamic viscosity of the thermal-curable resin composition, and using a filler at the specified amount can maintain high dimensional stability of the prepared electronic material. The detailed descriptions for the thermal-curable resin composition and the application thereof are provided as follows.

1. THERMAL-CURABLE RESIN COMPOSITION

The thermal-curable resin composition of the present invention comprises a thermal-curable resin component (A), a filler (B) as necessary components, and a phosphorus-containing flame retardant (C) together with other optional components that may be used depending on the need. The detailed descriptions for each component of the thermal-curable resin composition are provided as follows.

1.1. Thermal-Curable Resin Component (A)

As used herein, the thermal-curable resin component refers to a resin component which is gradually cured by a crosslinking reaction to form a network structure after being heated. The thermal-curable resin component can be provided from a single thermal-curable resin or by mixing a plurality of thermal-curable resins. In the thermal-curable resin composition of the present invention, the term "thermal-curable resin component (A)" especially refers to a general term for all the other reactive components excluding solvents, fillers and flame retardants. Specifically, the thermal-curable resin component (A) comprises a bismaleimide resin (a1), a cyanate ester resin (a2) and an epoxy resin (a3) as necessary components, and optional components that may be used depending on the need, such as benzoxazine resin (a4) (hereinafter called "BZ resin (a4)"), additives, and so on. The detailed descriptions for each component of the thermal-curable resin component (A) are provided as follows.

1.1.1. Bismaleimide Resin (a1)

As used herein, a bismaleimide resin refers to a compound with two maleimide functional groups. A bismaleimide resin has maleimide functional groups comprising reactive double bonds and thus can undergo a crosslinking reaction with other components comprising unsaturated functional groups or epoxy groups. The heat resistance of the prepared electronic materials can be improved when the resin composition comprises a bismaleimide resin. In some embodiments of the present invention, the bismaleimide resin has a structure represented by the following formula (I):

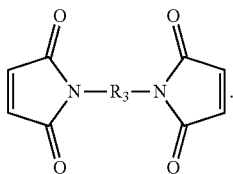

formula (I)

In formula (I), $R_3$ is selected from the following group consisting of: methylene (—$CH_2$—), 4,4'-diphenylmethane group

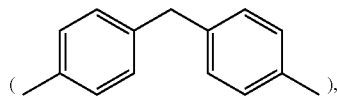

m-phenylene

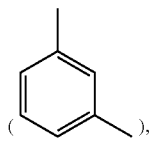

bisphenol A diphenyl ether group

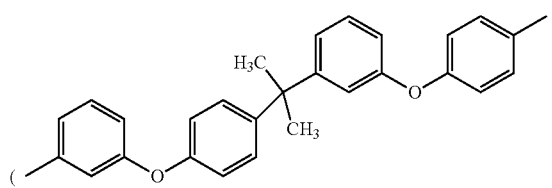

3,3'-dimethyl-5,5'-diethyl-4,4'-diphenylmethane group

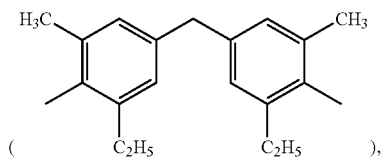

4-methyl-1,3-phenylene

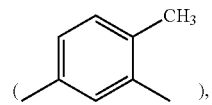

and 2,2,4-trimethyl-1,6-hexamethylene

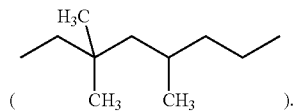

In the preferred embodiments of the present invention, $R_3$ is 3,3'-dimethyl-5,5'-diethyl-4,4'-diphenylmethane group

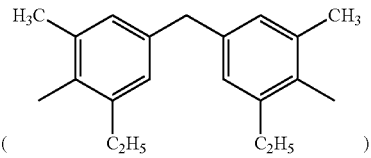

Specific examples of the bismaleimide resin include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimido-diphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide and N,N'-methylene bis(3-chloro-p-phenylene)bismaleimide. Commercially available bismaleimide resins include BMI-70 and BMI-80 available from KI Chemical company and BMI-1000, BMI-4000, BMI-5000, BMI-5100 and BMI-7000 available from Daiwa Fine Chemical company. The aforementioned bismaleimid resin can either be used alone or in any combination, and persons with ordinary skill in the art can adjust the amount of the bismaleimide resin depending on the need. In the appended examples, 3,3'-dimethyl-5,5'-diethyl-4,4'-diphenylmethylbismaleimide (that is, in formlua (I), $R_3$ is 3,3'-dimethyl-5,5'-diethyl-4,4'-diphenylmethyl group

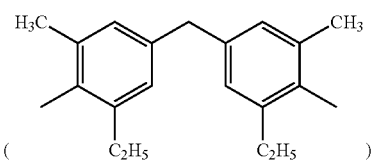

( is used.

1.1.2. Cyanate Ester Resin (a2)

As used herein, the cyanate ester resin refers to a chemical substance mainly composed of a derivative of bisphenol or phenol, wherein the H of at least one of hydroxyl group (—OH) of a derivative of bisphenol or phenol is substituted by a cyano group. Due to the —OCN group, the cyanate ester resin can form a trimer by a crosslinking reaction, or undergo a crosslinking reaction with other components having unsaturated functional groups to form a network structure. In the thermal-curable resin composition of the present invention, the type of the cyanate ester resin (a2) is not particularly limited as long as it has an —OCN functional group.

Examples of the cyanate ester resin include but are not limited to 2,2-bis(4-cyanooxyphenyl)propane, 4,4'-ethylidene bisphenylenecyanate, 4,4'-dicyanooxybiphenyl, bis(4-cyanooxy-3,5-dimethylphenyl)methane, bis(4-cyanooxyphenyl) sulfide, bis(4-cyanooxyphenyl)ether, a prepolymer of bisphenol A dicyanate ester, 1,1-bis(4-cyanooxyphenyl)ethane, 1,1-bis(4-cyanooxyphenyl)methane, 1,3-bis(4-cyanooxyphenyl-1-(methylethylidene)) benzene, bis(4-cyanooxyphenyl) ether, bis(4-cyanooxyphenyl)-2,2-butane, 1,3-bis[2-(4-cyanooxyphenyl)propyl]benzene, tris(4-cyanooxyphenyl)ethane, cyanated phenol, an adduct of cyanated phenol dicyclopentadiene, and combinations thereof. Commercially available cyanate ester resins include: Primaset PT-15, PT-30S, PT-60S, CT-90, BADCY, BA-100-10T, BA-200, BA-230S, BA-300S, BTP-2500, BTP-6020S, DT-4000, DT-7000, Methylcy, and ME-240S available from LONZA company. In the appended examples, 2,2-bis(4-cyanooxyphenyl)propane is used.

It has been found that although the bismaleimide resin can improve the glass transition temperature (Tg), rigidity and dielectric properties of the electronic material prepared from the thermal-curable resin composition, it may adversely increase the dynamic viscosity of the thermal-curable resin composition and is unfavorable to the preparation of multilayer boards. However, such disadvantages are effectively and unexpectedly ameliorated in the presence of the cyanate ester resin at the specified amount. Therefore, in the thermal-curable resin composition of the present invention, the ratio of the content of the bismaleimide resin (a1) to the content of the cyanate ester resin (a2) is preferably 1:1.5 to 1:0.5. That is, the cyanate ester resin (a2) is in an amount ranging from 50 parts by weight to 150 parts by weight per 100 parts by weight of the bismaleimide resin (a1), such as 55 parts by weight, 60 parts by weight, 65 parts by weight, 70 parts by weight, 75 parts by weight, 80 parts by weight, 85 parts by weight, 90 parts by weight, 95 parts by weight, 100 parts by weight, 105 parts by weight, 110 parts by weight, 115 parts by weight, 120 parts by weight, 125 parts by weight, 130 parts by weight, 135 parts by weight, 140 parts by weight, or 145 parts by weight. If the content of the cyanate ester resin (a2) is greater than 1.5 times the content of the bismaleimide resin (a1), the Df value of the prepared electronic material is too high (for example, the Df value is higher than 0.006 at 10 GHz) to be suitable for high frequency applications. On the other hand, if the content of the cyanate ester resin (a2) is less than 0.5 times the content of the bismaleimide resin (a1), the dynamic viscosity of the thermal-curable resin composition may not reduce effectively.

1.1.3. Epoxy Resin (a3)

As used herein, the epoxy resin refers to a thermal-curable resin with at least two epoxy functional groups in each molecule, such as a multifunctional epoxy resin and a linear phenolic epoxy resin. Examples of the multifunctional epoxy resin include but are not limited to a bifunctional epoxy resin, a tetrafunctional epoxy resin and an octafunctional epoxy resin. In the thermal-curable resin composition of the present invention, the type of the epoxy resin (a3) is not particularly limited, and the epoxy resin (a3) can be used by persons with ordinary skill in the art depending on the need based on the disclosure of the present invention. For example, when the flame retardance of the resin composition is taken into consideration, a halogen-containing epoxy resin can be used; or when enviromental regulations restrict the use of halogen, a halogen-free epoxy resin can be used.

For example, the epoxy resin that can be used in the thermal-curable resin composition of the present invention includes: a phenol phenolic epoxy resin, a bisphenol A epoxy resin, a bisphenol F epoxy resin, a bisphenol S epoxy resin, a cresol phenolic epoxy resin, a bisphenol A phenolic epoxy resin, a bisphenol F phenolic epoxy resin, a diphenylethylene epoxy resin, a triazine skeleton-containing epoxy resin, a fluorene skeleton-containing epoxy resin, a triphenol methane epoxy resin, a biphenyl epoxy resin, a xylylene epoxy, a biphenyl aralkyl epoxy resin, a naphthalene epoxy resin, a DCPD-type epoxy resin, and an alicyclic epoxy resin.

Examples of the epoxy resin that can be used in the thermal-curable resin composition of the present invention include but are not limited to 1,4-butanediol diglycidyl ether, 1,6-hexanediol diglycidyl ether, (poly)ethylene glycol diglycidyl ether, (poly)propylene glycol diglycidyl ether, trimethylolethane triglycidyl ether, trimethylolpropane triglycidyl ether, 1,4-cyclohexane dimethanol diglycidyl ether, 1,2-epoxy-4-(epoxyethyl)cyclohexane, glycerol triglycidyl ether, diglycerol poly diglycidyl ether, 2,6-diglycidyl phenyl glycidyl ether, 1,1,3-tris(4-glycidyloxyphenyl)propane, diglycidyl 1,2-cyclohexanedicarboxylate, 4,4'-methylenebis (N,N-diglycidyl aniline), 3',4'-epoxycyclohexylmethyl 3,4-epoxycyclohexanecarboxylate, triglycidyl-p-aminophenol, tetraglycidyl-m-xylylenediamine, tetraglycidyl diamino diphenylmethane, tetraglycidyl-1,3-bisaminomethylcyclohexane, bisphenol A diglycidyl ether, bisphenol S diglycidyl ether, tetrabromobisphenol A diglycidyl ether, hydrogenated bisphenol A diglycidyl ether, pentaerythritol diglycidyl ether, pentaerythritol tetraglycidyl ether, pentaerythritol polyglycidyl ether, resorcinol diglycidyl ether, diglycidyl phthalate, diglycidyl tetrahydrophthalate, neopentyl glycol diglycidyl ether, bisphenol hexafluoroacetone diglycidyl ether, triglycidyl isocyanurate, tris(3,4-epoxybutyl) isocyanurate, tris(4,5-epoxypentyl) isocyanurate, tris(5,6-epoxyhexyl) isocyanurate, tris(7,8-epoxyoctyl) isocyanurate, tris (2-glycidoxyethyl) isocyanurate, monoallyl diglycidyl isocyanurate, N,N'-diglycidyl-N"-(2,3-dipropionyloxypropyl)isocyanurate, tris(2,2-bis(glycidoxymethyl)butyl)-3,3', 3"-(2,4,6-trioxo-13,5-triazine-1,3,5-triyl) tripropionate, sorbitol polyglycidyl ether, diglycidyl adipate, dibromophenyl glycidyl ether, 1,2,7,8-diepoxyoctane, 1,6-dimethylol perfluorohexane diglycidyl ether, 4-(spiro[3,4-epoxycyclohexane-1,5'-[1,3]dioxane]-2'-yl)-1,2-epoxycyclohexane, 1,2-bis(3,4-epoxycyclohexylmethoxy)ethane, 4',5'-epoxy- 2'-methylcyclohexylmethyl 4,5-epoxy-2-methylcyclohexanecarboxylate, ethylene glycol bis(3,4-epoxycyclohexane carboxylate), bis(3,4-epoxycyclohexylmethyl) adipate, and bis(2,3-epoxycyclopentyl) ether. Examples of the epoxy resin may further include diglycidyl ether compounds of polyfunctional phenols and polycyclic aromatics, such as anthracene. Furthermore, phosphorus may be introduced into the epoxy resin to form a phosphorus-containing epoxy resin. An example of the phosphorus-containing epoxy resin is a DOPO-modified epoxy resin, wherein DOPO is 9,10-dihydro-9-oxa-10-phosphahenanthrene-10-oxide.

The abovementioned epoxy resins can either be used alone or in any combination, and persons with ordinary skill in the art can make selections depending on the practical needs. Considering the desired rigidity, Df value and heat resistance of the prepared electronic materials, a multifunctional epoxy resin with a high Tg and a low Df, such as a DCPD-type epoxy resin, a naphthalene epoxy resin, or a phenolic epoxy resin, can be used. In the appended Examples, phenolic epoxy resin is used.

It has been found that although the epoxy resin can reduce the dynamic viscosity of the resin composition, it may adversely increase the Df value of the prepared electronic materials. Therefore, in the thermal-curable resin composition of the present invention, the ratio of the content of the bismaleimide resin (a1) to the content of the epoxy resin (a3) is preferably 1:0.24 to 1:0.51; that is, the epoxy resin (a3) is preferably in an amount ranging from 24 parts by weight to 51 parts by weight per 100 parts by weight of the bismaleimide resin (a1), such as 25 parts by weight, 28 parts by weight, 30 parts by weight, 32 parts by weight, 35 parts by weight, 38 parts by weight, 40 parts by weight, 42 parts by weight, 45 parts by weight, 48 parts by weight, or 50 parts by weight. If the content of the epoxy resin (a3) is less than the stated preferred range, the dynamic viscosity of the thermal-curable resin composition may not be low enough to be suitable for the preparation of multi-layer boards. On the other hand, if the content of the epoxy resin (a3) is greater than the stated preferred range, the Df value of the prepared electronic material may be too high (for example, Df is higher than 0.006 at 10 GHz) to be suitable for high-frequency applications.

1.1.4. BZ Resin (a4) (Optional Component)

In the thermal-curable resin composition of the present invention, the thermal-curable resin component (A) may further comprise a BZ resin (a4) to increase the reactivity of the thermal-curable resin composition. As used herein, the BZ resin refers to a component produced from a phenolic hydroxy compound, a monoamine compound and formaldehyde in accordance with the following reaction formula (z):

reaction formula (z)

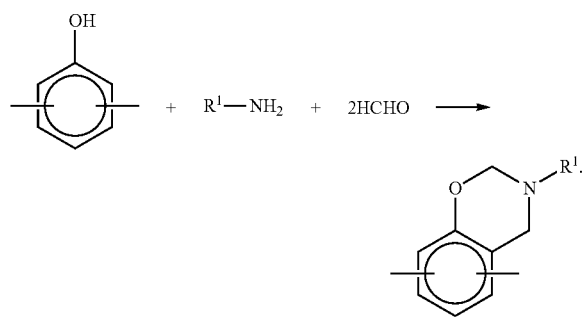

In the reaction formula (z), the $R^1$ group of the monoamine compound ($R^1$—$NH_2$) can be an alkyl group, a cycloalkyl group, a phenyl group, or an alkyl- or alkoxy-substituted phenyl group. Examples of the monoamine compound ($R^1$—$NH_2$) include but are not limited to methylamine, aniline and aniline with a substituent. Examples of the phenolic hydroxy compound include but are not limited to polyfunctional phenols, biphenol compounds, bisphenol compounds, trisphenol compounds, and phenolic resins. Examples of polyfunctional phenols include but are not limited to catechol, resorcinol, and hydroquinone. Examples of bisphenol compounds include but are not limited to bisphenol A, bisphenol F, and bisphenol S. Examples of phenolic resins include but are not limited to novolac varnish resins and melamine phenolic resins.

In addition, the BZ resin used in the thermal-curable resin composition of the present invention may also be as a prepolymer of the BZ resin which undergoes a ring-opening polymerization in advance. The preparation of such a prepolymer of the BZ resin can be found in, for example, US 2012/0097437 A1, the subject matters of which are incorporated herein in their entirety by reference. Commercially available BZ resins include LZ 8280 available from Huntsman company, PF-3500 available from Chang Chun Chemical, and BP-100N and OP-100N available from JFE Chemicals.

It has been found that a small amount of BZ resin can effectively increase the reactivity of the thermal-curable resin composition at high-temperature pressing, and shorten the time required for high-temperature pressing. Accordingly, in the thermal-curable resin composition of the present invention, the BZ resin (a4) is preferably in an amount ranging from 3 parts by weight to 10 parts by weight per 100 parts by weight of the thermal-curable resin component (A), such as 3.2 parts by weight, 3.5 parts by weight, 3.8 parts by weight, 4 parts by weight, 4.3 parts by weight, 4.5 parts by weight, 4.7 parts by weight, 5 parts by weight, 5.2 parts by weight, 5.5 parts by weight, 5.8 parts by weight, 6 parts by weight, 6.2 parts by weight, 6.5 parts by weight, 6.8 parts by weight, 7 parts by weight, 7.3 parts by weight, 7.5 parts by weight, 7.7 parts by weight, 8 parts by weight, 8.2 parts by weight, 8.5 parts by weight, 8.8 parts by weight, 9 parts by weight, 9.2 parts by weight, 9.5 parts by weight, or 9.8 parts by weight. If the content of the BZ resin (a4) is greater than the stated preferred range, the dynamic viscosity of the resin composition may be undesirably increased, which is unfavorable to applications of multi-layer boards. On the other hand, if the content of the BZ resin (a4) is less than the stated preferred range, the reactivity of the resin composition cannot be effectively increased.

1.1.5. Additive (Optional Component)

In addition to the necessary components (a1) to (a3) and the optional component (a4), the thermal-curable resin composition of the present invention may further include additives well-known to persons with ordinary skill in the art to adaptively improve the workability of the resin composition during the manufacturing or the physicochemical properties of the electronic material prepared from the resin composition. Additives well-known to persons with ordinary skill in the art include but are not limited to a catalyst and a co-crosslinking agent as illustrated below.

1.1.5.1. Catalyst

In the thermal-curable resin composition of the present invention, the thermal-curable resin component (A) may further comprise a catalyst to promote the epoxy functional group reaction and to lower the curing reaction temperature of the resin composition. The type of the catalyst is not particularly limited as long as it can promote the ring-opening reaction of epoxy functional groups and lower the curing reaction temperature. The suitable catalysts include but are not limited to tertiary amines, quaternary ammonium salts, imidazoles, or pyridines, wherein each mentioned curing accelerator can either be used alone or in combination. Examples of the tertiary amine include but are not limited to dimethylbenzylamine, 2-dimethylaminomethylphenol, and 2,4,6-tris(dimethylaminomethyl)phenol. Examples of the imidazoles include but are not limited to 2-methylimidazole, 2-ethyl-4-methyl imidazole, and 2-phenylimidazole. Examples of the pyridines include but are not limited to 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. In some embodiments of the present invention, imidazoles and pyridines are used.

In addition, to promote the reaction of cyanate esters with other components, metal catalysts can be used. Metal catalysts include but are not limited to zinc, cobalt, copper, manganese, aluminum, and magnesium. In the appended Examples, zinc is used.

In general, the catalyst may be in an amount ranging from 0 parts by weight to 5 parts by weight per 100 parts by weight of the thermal-curable resin component (A), such as 0.0001 parts by weight, 0.0003 parts by weight, 0.0005 parts by weight, 0.0007 parts by weight, 0.001 parts by weight, 0.003 parts by weight, 0.005 parts by weight, 0.007 parts by weight, 0.01 parts by weight, 0.03 parts by weight, 0.05 parts by weight, 0.07 parts by weight, 0.1 parts by weight, 0.2 parts by weight, 0.3 parts by weight, 0.5 parts by weight, 0.7 parts by weight, 1 part by weight, 2 parts by weight, or 3 parts by weight, but the present invention is not limited thereto, and persons with ordinary skill in the art can adjust the amount of the catalyst depending on the need.

1.1.5.2. Co-Crosslinking Agent

In the thermal-curable resin composition of the present invention, the thermal-curable resin component (A) may further comprise a co-crosslinking agent, thereby further enhancing the properties of the prepared electronic materials. In general, the co-crosslinking agent may be in an amount ranging from 0.5 wt % to 5 wt % per 100 parts by weight of the thermal-curable resin component (A), but the present invention is not limited thereto, and persons with ordinary skill in the art can adjust the amount of the co-crosslinking agent depending on the need. Examples of the co-crosslinking agent may include an OH group-containing compound, an amino group-containing compound, a carboxyl group-containing compound, or an anhydride, an active ester-containing compound, and so on, wherein each mentioned co-crosslinking agent can either be used alone or in combination.

Examples of the OH group-containing compound include but are not limited to a bisphenol compound, such as bisphenol A, tetrabromobisphenol A, bisphenol S, or bisphenol F; a dicyclopentadiene (DCPD)-phenol copolymer; and a phenolic resin.

Examples of the amino group-containing compound include but are not limited to dicyandiamide (DICY), diamino diphenylsulfone (DDS), diamino diphenylmethane (DDM), amino triazine novolac (ATN) resin, and guanamine. The guanamine may include 6-substituted guanamine, such as benzoguanamine, aceto-guanamine and caprinoguanamine.

A carboxyl group-containing compound refers to a compound with a —COOH group.

An anhydride refers to an organic compound with two acyl groups bonded to the same oxygen atom, wherein the anhydride is generally formed by dehydrating an organic acid. Specific examples of the anhydride include but are not limited to a monoanhydride, a dianhydride, a polyanhydride, and a copolymer of the foregoing anhydrides and other copolymerizable monomers. Examples of the copolymer of anhydride and other copolymerizable monomers include but are not limited to a copolymer of styrene and maleic anhydride (hereinafter called "SMA copolymer"). The SMA copolymer is a copolymer formed by the copolymerization of a styrene monomer and maleic anhydride, and it can provide the effect of lowering the Dk, Df and Tg of the electronic materials prepared from the thermal-curable resin composition. In general, the SMA copolymer can have the following structure of formula (II):

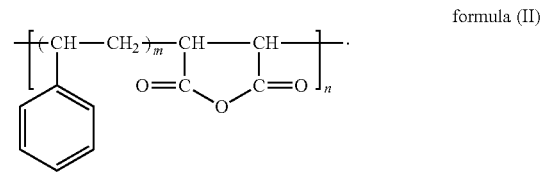

formula (II)

In formula (II), m is an integer from 1 to 10 and n is an integer from 8 to 12.

When the resin composition comprises the SMA copolymer presented by formula (II), the higher the molar ratio of repeating units derived from styrene to repeating units derived from maleic anhydride in the SMA copolymer (i.e., the larger the m value), the lower the Df value of electronic materials prepared from the resin composition (i.e., the better the dielectric propoerties). Moreover, if the content of repeating units derived from maleic anhydride is pretty low, then the Tg is also relatively low. For example, when m is 1, the Tg of the prepared electronic material is about 155° C.; when m is 8, the Tg of the prepared electronic material is merely about 104° C. Furthermore, when the molar ratio of repeating units derived from styrene to repeating units derived from maleic anhydride is relatively high (e.g. m≥8), the surface of the prepared prepreg will have greater tackiness, which causes the prepregs to easily adhere to each other, thereby causing them to be unfavorable to subsequent processing operations. Conversely, the lower the content of repeating units derived from styrene in the SMA copolymer (i.e., the smaller the m value, e.g. m≤3), the higher the Tg, and the better the heat resistance of the prepared electronic material. However, the prepared electronic material becomes more brittle, which can cause dust generation during subsequent processing. Therefore, in the SMA copolymer, the molar ratio of repeating units derived from styrene to repeating units derived from maleic anhydride preferably ranges from about 3 to about 8. The SMA copolymer can be for example, SMA EF-80 (m=8), SMA EF-60 (m=6), SMA EF-40 (m=4), SMA EF-30 (m=3) and SMA-3000 (m=3), all available from the CRAY VALLEY company.

An active ester-containing compound can be an aromatic polyester obtained by the polymerization reaction of an aromatic dicarboxylic acid (or a derivative thereof) and a bisphenol compound (or a derivative thereof). The polymerization reaction can be carried out by a well-known polymerization method such as solution polymerization, interfacial polymerization, or melt polymerization. Examples of the aromatic dicarboxylic acid include but are not limited to terephthalic acid, isophthalic acid, phthalic acid, chlorophthalic acid, nitrophthalic acid, 2,5-naphthalenedicarboxylic acid, 2,6-naphthalenedicarboxylic acid, 2,7-naphthalenedicarboxylic acid, 1,5-naphthalenedicarboxylic acid, methylterephthalic acid, 4,4'-biphenyldicarboxylic acid, 2,2'-biphenyldicarboxylic acid, 4,4'-diphenyl ether dicarboxylic acid, 4,4'-diphenylmethane dicarboxylic acid, 4,4'-diphenylsulfone dicarboxylic acid, 4,4'-diphenylisopropylidenedicarboxylic acid, 1,2-bis(4-carboxylphenoxy)ethane, and sodium isophthalate-5-sulfonate. Each mentioned aromatic dicarboxylic acid can either be used alone or in any combination. Among the examples of aromatic dicarboxylic acids mentioned above, it is preferable to use terephthalic acid, isophthalic acid, or a mixture thereof, and more preferable to use a mixture of terephthalic acid and isophthalic acid. Examples of the bisphenol compound include but are not limited to bis(4-hydroxyphenyl)phenylmethane, 1,1-bis(4-hydroxyphenyl)-1-phenylethane (bisphenol AP, BPAP), 1,1-bis(4-hydroxy-3-methylphenyl)-1-phenylethane, 1,1-bis(4-hydroxy-3,5-dimethylphenyl)-1-phenylethane, 1,1-bis(4-hydroxy-3,5-dibromophenyl)-1-phenylethane, 1,1-bis(4-hydroxy-3-phenylphenyl)-1-phenylethane, bisphenol A (BPA), 2,2-bis(4-hydroxy-3,5-dimethylphenyl)propane (tetramethylbisphenol A), 2,2-bis(4-hydroxy-3-methylphenyl)propane (bisphenol C, BPC), tetrabromobisphenol A, 2,2-bis(4-hydroxy-3,5-dichlorophenyl)propane (tetrachrolobisphenol A), and a dicyclopentadiene-phenol polymer. Each mentioned bisphenol compound can either be used alone or in any combination. Commercially available bisphenol compounds include HPC-8000-65T available from Japan DIC company, or V575 available from Japan UNITIKA company.

1.2. Filler (B)

The thermal-curable resin composition of the present invention comprises a filler to improve the mechanical strength, the thermal conductivity and the dimensional stability of the prepared electronic materials. Examples of the suitable filler include but are not limited to silicon dioxide (e.g., hollow silicon dioxide), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like, graphite, calcined kaolin, pryan, mica, hydrotalcite, PTFE powder, glass bead, ceramic whisker, carbon nanotube, nanosized inorganic powder, and combinations thereof.

In the thermal-curable resin composition of the present invention, the shape of the filler is not particularly limited and may be, for example, a spherical shape, a fibrous shape, a plate shape, a granular shape, a sheet shape a whiskered shape, or the like, but the present invention is not limited thereto. Furthermore, the size of the filler is not particularly limited. In the case of a spherical or granular filler, the average particle diameter is generally less than 10 μm, and preferably from 0.1 μm to 5 μm.

In addition, to increase the compatibility between the filler and other components of the thermal-curable resin composition, the filler may be surface-modified with a coupling agent before being added into the thermal-curable resin composition. Examples of the coupling agent include but are not limited to silane-based coupling agents, titanate-based coupling agents, and polysiloxane coupling agents with low degree of polymerization.

In order to meet the high requirements for the dimensional stability of multi-layer boards, the thermal-curable resin composition of the present invention contains a large amount of filler, such that the thermal-curable resin composition has high filler loading. The so-called "large amount of filler" means that based on the dry weight of the thermal-curable resin composition, the amount of the filler is at least 40 wt %, at least 50 wt %, or even at least 60 wt %. In the thermal-curable resin composition of the present invention, the filler (B) is preferably in an amount ranging from 40 parts by weight to 55 parts by weight per 100 parts by weight of the dry weight of the thermal-curable resin composition, such as 41 parts by weight, 42 parts by weight, 43 parts by weight, 44 parts by weight, 45 parts by weight, 46 parts by weight, 47 parts by weight, 48 parts by weight, 49 parts by weight, 50 parts by weight, 51 parts by weight, 52 parts by weight, 53 parts by weight, or 54 parts by weight.

Regarding the problem of a high filler loading amount resulting in a high dynamic viscosity in conventional resin compositions, the thermal-curable resin component (A) with a specific composition of the present invention overcomes the problem, wherein the thermal-curable resin composition has a dynamic viscosity of not higher than 800 Pa·s in a semi-cured state despite having high filler loading, making it favorable to the production of multi-layer boards.

1.3. Phosphorus-Containing Flame Retardant (C)

The thermal-curable resin composition of the present invention may optionally further comprise a phosphorus-containing flame retardant (C) to improve the heat resistance and the dimensional stability. The type of the phosphorus-containing flame retardant is not particularly limited as long as it can provide flame retardance without impairing the dynamic viscosity and the Df value of the thermal-curable resin composition of the present invention. Examples of the phosphorus-containing flame retardant include but are not limited to a metal phosphinate, a polyphosphate, a phosphonium salt, a phosphate ester, a phosphazene compound, a phosphite ester, and a phosphine oxide. Examples of the phosphine oxide include but are not limited to a diphenyl phosphine oxide compound. Each flame retardant can be used alone or in any combination. In some embodiments of the present invention, the phosphorus-containing flame retardant (C) is selected from the group consisting of a metal phosphinate, a diphenyl phosphine oxide compound, a phosphazene compound, and combinations thereof.

A metal phosphinate and a diphenyl phosphine oxide compound are high-melting point phosphorus-containing flame retardants (with melting points higher than 250° C.), while a phosphazene compound is a low-melting point phosphorus-containing flame retardant (with melting point lower than 120° C.). It has been found that using a combination of a high-melting point phosphorus-containing flame retardant and a low-melting point phosphorus-containing flame retardant can unexpectedly avoid or at least reduce a unfavorable increase in the dynamic viscosity of the thermal-curable resin composition of the present invention. Accordingly, in the preferred embodiments of the present invention, the combination of a metal phosphinate and a phosphazene compound is used, or the combination of a diphenyl phosphine oxide compound and a phosphazene compound is used.

Commercially available phosphinates include OP935 available from the CLARIANT company. Commercially available polyphosphates include Melapur 200, available from BASF company. Commercially available phosphate esters include PX-200 and PX-202 available from Daihachi Chemical Industry company, and CG-686 and CG-RDP available from Chembridge company. Commercially available phosphazenes include SPB-100, SPH-100 and SPV-100, all available from Otsuka Chemical company. Commercially available phosphine oxides include PQ-60 available from Chin Yee Chemical Industry company, and BPO-13 and BPE-3 available from Katayama Chemical Industries company.

Without being bound by theory, it is believed that an excessive total amount of phosphorus atoms may adversely affect the dielectric properties and heat resistance of electronic materials prepared from thermo-curable resin compositions. Accordingly, the total amount of the phosphorus atoms in the resin composition ranges from 2 wt % to 6 wt %, based on the total weight of the resin solid content, to allow the prepared electronic material to have satisfactory flame retardance without adversely affecting the dynamic viscosity of the thermal-curable resin composition and Df values of the prepared electronic materials.

1.4. Preparation of Thermal-Curable Resin Composition

The thermal-curable resin composition of the present invention may be prepared into a varnish for subsequent applications by evenly mixing the thermal-curable resin component (A) including the resin (a1) to (a3), the optional resin (a4) and additives, the filler (B), and other optional components (for example, the phosphorus-containing flame retardant (C)) through a stirrer, and dissolving or dispersing the obtained mixture into a solvent. The solvent here can be any inert solvent that can dissolve or disperse the components of the resin composition of the present invention but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). Each mentioned solvent can be used alone or in combination. The amount of the solvent is not particularly limited as long as the components of the resin composition can be evenly dissolved or dispersed therein. In the appended Examples, a mixture of toluene, methyl ethyl ketone and γ-butyrolactone is used as the solvent.

2. PREPREG

The present invention also provides a prepreg prepared from the abovementioned resin composition, wherein the prepreg is prepared by impregnating a substrate with the abovementioned resin composition or by coating the abovementioned resin composition onto a substrate and drying the impregnated or coated substrate. Examples of the substrate include but are not limited to glass fiber reinforcing materials (e.g., glass-fiber woven fabrics or non-woven fabrics, glass papers, or glass mats), kraft papers, short fiber cotton papers, natural fiber cloths, and organic fiber cloths (e.g., cloths of liquid crystal polymer fiber). In some embodiments of the present invention, 2116 glass fiber cloth is used as the substrate, and the substrate is heated and dried at 175° C. for 2 to 15 minutes (B-stage) to provide a semi-cured prepreg.

3. METAL-CLAD LAMINATE AND PRINTED CIRCUIT BOARD

The present invention also provides a metal-clad laminate prepared from the abovementioned prepreg, which comprises a composite layer and a metal layer. The metal-clad laminate can be prepared by laminating the abovementioned prepreg and a metal foil, or by coating the resin composition onto a metal foil and then drying the coated metal foil, wherein the composite layer is provided by the abovementioned prepreg. In the case of the preparation of the metal-clad laminate by using the prepreg, the metal-clad laminate can be prepared by superimposing a plurality of the abovementioned prepregs, superimposing a metal foil (such as a copper foil) on at least one external surface of the composite layer composed of the superimposed prepregs to provide a superimposed object, and then performing a hot-pressing operation onto the superimposed object to obtain the metal-clad laminate.

Furthermore, the metal-clad laminate can form a printed circuit board by further patterning the external metal foil thereof.

4. EXAMPLES

4.1. Testing Method

The present invention is further illustrated by the embodiments hereinafter, wherein the testing instruments and methods are as follows:

[Glass Transition Temperature (Tg) Test]

The glass transition temperature (Tg) of the thermal-curable resin composition is measured by using a Dynamic Mechanical Analysis (DMA). The measuring method is as follows: setting the initial temperature to 30° C., the ending temperature to 400° C. and the heating rate to 2° C./min, and under such conditions, measuring the modulus change of the thermal-curable resin composition during the curing process, and then taking the maximum value of the measured storage modulus (E')/loss modulus (E") as Tg. The measuring methods for Tg are the IPC-TM-650.2.4.25C and the 24C testing method of the Institute for Interconnecting and Packaging Electronic Circuits (IPC).

[Storage Modulus (E') Test]

The storage modulus (E') of the thermal-curable resin composition at 250° C. is measured by using a DMA. The unit of the E' is million Pa (MPa).

[Coefficient of Thermal Expansion (CTE) Test]

The coefficient of thermal expansion (CTE) of the thermal-curable resin composition cured completely is measured by using a Thermomechanical Analyzer (TMA). The measuring method is as follows: preparing a test sample (5 mm×5 mm×1.5 mm) of the thermal-curable resin composition cured completely, setting the initial temperature to 30° C., the ending temperature to 330° C., the heating rate to 10° C./min, and the loading to 0.05 Newton (N), and under such conditions, subjecting the test sample to thermomechanical analysis in an expansion/compression mode, and measuring and averaging the amount of thermal expansion per 1° C. in the temperature range of 30° C. to 330° C. The unit of the CTE is %.

[Dynamic Viscosity Test]

The dynamic viscosity of the thermal-curable resin composition in a semi-cured state (B-stage) is measured by using a rheometer (model: AR1500 available from TA Instrument company). The measuring method is as follows: setting the initial temperature to 30° C., the ending temperature to 200° C. and the heating rate to 2° C./min, under such conditions, measuring the dynamic viscosity of the thermal-curable resin composition in a semi-cured state (B-stage), wherein such dynamic viscosity in a semi-cured state (B-stage) is the dynamic viscosity when the conversion ratio of the thermal-curable resin is 50±5%. The unit of the dynamic viscosity is Pa·s.

19

[Solder Resistance Test]

A solder resistance test is carried out by immersing the dried metal-clad laminate in a solder bath at 288° C. for 20 seconds, then taking it out, repeating the abovementioned immersing-taking out and observing whether there are any defects, such as delamination or blistering. Record the immersion times of the metal-clad laminate in the event of a defect.

[Dielectric Constant (Dk) and Dissipation Factor (Df) Measurement]

The dielectric constant (Dk) and dissipation factor (Df) of the dielectric layer (the resin content (RC) is 70%) are measured according to IPC-TM-650 2.5.5.13 under an operating frequency of 10 GHz, wherein the dielectric layer refers to a component obtained by etching away the metal foil of the metal-clad laminate.

[Pressing Time Test]

The metal-clad laminate is placed in a hot-pressing operation for pressing according to the preparing method of a metal-clad laminate as described herein, the pressing temperature is set to 200° C., and a plurality of different pressing times are specified for testing. The time required for the metal-clad laminate to be just cured completely (i.e., the Tg curve no longer changes) is defined as the pressing time.

4.2. Raw Materials Used in Test Examples, Examples and Comparative Examples List

TABLE 1

Raw Material List

| Model No. | Description |
|---|---|
| BMI-5100 | Bismaleimide resin, available from Daiwa Fine Chemical Company |
| BA-230S | Cyanate ester resin, dry weight of 75%, available from LONZA Company |
| PNE-177 | Phenolic epoxy resin, dry weight of 85%, available from Chang Chun Company |
| LZ-8280 | Bisphenol A-type BZ resin, available from Huntsman Company |
| 525ARI | Surface-treated SiO2 filler, available from Sibelco Company |
| PQ-60 | Diphenyl phosphine oxide compound, available from Chin Yee Chemical industry Company |
| OP-935 | Aluminum phosphinate, available from CLARIANT Company |
| SPV-100 | Phosphazene compound, available from Otsuka Chemical Company |
| Zinc | Catalyst, available from Union Chemical Company |
| MEK | Methyl ethyl ketone, available from Fluka Company |

20

4.3. Test Examples: Effect of the Ratio of the Amount of Bismaleimide Resin (a1) to Cyanate Ester Resin (a2)

4.3.1. Preparation of Thermal-Curable Resin Composition

The thermal-curable resin compositions of Test Examples 1 to 5 were prepared according to the constitutions shown in Table 2-1. In detail, the components were mixed at room temperature with a stirrer, and thereafter, the solvent was added thereinto. After stirring the resultant mixture at room temperature for 60 to 120 minutes, the thermal-curable resin compositions were obtained. The total amount of the phosphorus atoms was calculated based on the resin solid content.

TABLE 2-1

Constitutions of the thermal-curable resin compositions of Test Examples

| Unit: Parts by weight | | Test Example | | | | |
|---|---|---|---|---|---|---|
| | | 1 | 2 | 3 | 4 | 5 |
| Bismaleimide resin (a1) | BMI-5100 | 100 | 100 | 100 | 100 | 100 |
| Cyanate ester resin (a2) | BA-230S | 66.67 | 100 | 133 | 200 | 267 |
| Filler (B) | 525ARI | 150 | 175 | 200 | 240 | 300 |
| Phosphorus-containing flame retardant (C) | OP-935 | 18 | 21 | 24 | 28 | 35 |
| Catalyst | Zinc | 0.1 | 0.1 | 0.1 | 0.1 | 0.1 |
| Solvent | MEK | 170 | 200 | 240 | 270 | 300 |
| Resin (a1):resin (a2) (based on resin solid content) | | 1:0.5 | 1:0.75 | 1:1 | 1:1.5 | 1:2 |
| Total amount of phosphorus atoms (wt %) | | 2.46 | 2.46 | 2.42 | 2.41 | 2.41 |

4.3.2. Preparation and Properties of Prepreg and Metal-Clad Laminate

The prepregs and metal-clad laminates were respectively prepared by using the thermal-curable resin compositions of Test Examples 1 to 5. In detail, one of the resin compositions of Test Examples 1 to 5 was coated on glass fiber cloths (type: 2116; thickness: 0.08 mm) by a roller at a controlled thickness. The coated glass fiber cloths were then placed in an oven and dried at 175° C. for 2 to 15 minutes to produce prepregs in a semi-cured state (B-stage) (the resin content of the prepreg was about 70%). Four pieces of the prepregs were superimposed and two sheets of copper foil (each 0.5 oz.) were respectively superimposed on both of the two external surfaces of the superimposed prepregs to provide a superimposed object. A hot-pressing operation was performed on each of the prepared objects. The hot-pressing conditions were as follows: heating to about 200° C. to 220° C. at a heating rate of 3.0° C./min, and hot-pressing for 180 minutes under a full pressure of 15 kg/cm$^2$ (initial pressure is 8 kg/cm$^2$) at said temperature.

The properties of the thermal-curable resin compositions, the prepregs and the metal-clad laminates of Test Examples 1 to 5, including the Tg, storage modulus, CTE, dynamic viscosity, solder resistance, Dk, and Df, were measured according to the aforementioned testing methods, and the results are tabulated in Table 2-2.

TABLE 2-2

Properties of the thermal-curable resin compositions, the prepregs and the metal-clad laminates of Test Examples

|  | Unit | Test Examples | | | | |
|---|---|---|---|---|---|---|
|  |  | 1 | 2 | 3 | 4 | 5 |
| Tg | °C. | 289 | 271 | 253 | 246 | 235 |
| Storage modulus | MPa | 19000 | 15000 | 10500 | 9800 | 7900 |
| CTE | % | 1.1 | 1.3 | 1.5 | 1.7 | 1.8 |
| Dynamic viscosity | Pa · s | 3245 | 2741 | 1993 | 1255 | 923 |
| Solder resistance | Number of times | >20 | >20 | >20 | >20 | >20 |
| Dk @ 10 GHz |  | 3.6 | 3.6 | 3.6 | 3.6 | 3.6 |
| Df @ 10 GHz |  | 0.0051 | 0.0055 | 0.0058 | 0.0059 | 0.0063 |

As shown in Table 2-1 and Table 2-2, when the ratio of the amount of the bismaleimide resin (a1) to the cyanate ester resin (a2) is 1:1.5 to 1:0.5, as shown in Test Examples 1 to 4, the thermal-curable resin composition has a suitable Tg and the prepared electronic material has a suitable Df. In contrast, as shown in Test Example 5, when the ratio of the amount of the bismaleimide resin (a1) to the cyanate ester resin (a2) is 1:2 (i.e., greater than 1:1.5), although the thermal-curable resin composition has a low dynamic viscosity, its Tg is poor and the Df of the prepared electronic material exceeds 0.006.

4.4. Examples and Comparative Examples 4.4.1. Preparation of Thermal-Curable Resin Composition The thermal-curable resin compositions of Examples 1 to 7 and Comparative Examples 1 to 3 were prepared according to the constitutions shown in Tables 3-1 to 3-3. In detail, the components were mixed at room temperature with a stirrer, and thereafter, a solvent was added thereinto. After stirring the resultant mixture at room temperature for 60 to 120 minutes, the thermal-curable resin compositions were obtained. The total amount of the phosphorus atoms was calculated based on the resin solid content.

TABLE 3-1

Constitutions of the thermal-curable resin compositions of Examples 1 to 4

|  |  | Examples | | | |
|---|---|---|---|---|---|
| Unit: Parts by weight |  | 1 | 2 | 3 | 4 |
| Bismaleimide resin (a1) | BMI-5100 | 100 | 100 | 100 | 100 |
| Cyanate ester resin (a2) | BA-230S | 200 | 200 | 200 | 200 |
| Epoxy resin (a3) | PNE-177 | 59 | 29 | 59 | 59 |
| Filler (B) | 525ARI | 290 | 270 | 290 | 290 |
| Phosphorus-containing flame retardant (C) | OP-935 | 33 | 30 | 20 | 20 |
|  | PQ-60 |  |  | 25 |  |
|  | SPV-100 |  |  |  | 20 |
| Catalyst | Zinc | 0.1 | 0.1 | 0.1 | 0.1 |
| Solvent | MEK | 310 | 270 | 310 | 310 |
| Resin (a1): resin (a2): resin (a3) (based on resin solid content) |  | 1:1.5:0.5 | 1:1.5:0.25 | 1:1.5:0.5 | 1:1.5:0.5 |
| Total amount of phosphorus atoms (wt %) |  | 2.27 | 2.26 | 2.20 | 2.20 |

TABLE 3-2

Constitutions of the thermal-curable resin compositions of Examples 5 to 7

| Unit: Parts by weight | | Examples 5 | 6 | 7 |
|---|---|---|---|---|
| Bismaleimide resin (a1) | BMI-5100 | 100 | 100 | 100 |
| Cyanate ester resin (a2) | BA-230S | 200 | 200 | 200 |
| Epoxy resin (a3) | PNE-177 | 59 | 59 | 59 |
| BZ resin (a4) | LZ-8280 | 10 | 20 | 30 |
| Filler (B) | 525ARI | 290 | 290 | 290 |
| Phosphorus-containing flame retardant (C) | OP-935 | 20 | 20 | 20 |
| | SPV-100 | 30 | 30 | 30 |
| Catalyst | Zinc | 0.1 | 0.1 | 0.1 |
| Solvent | MEK | 310 | 310 | 310 |
| Resin (a1): resin (a2): resin (a3) (based on resin solid content) | | 1:1.5:0.5 | 1:1.5:0.5 | 1:1.5:0.5 |
| Total amount of phosphorus atoms (wt %) | | 2.11 | 2.05 | 2.00 |

TABLE 3-3

Constitutions of the thermal-curable resin compositions of Comparative Examples

| Unit: Parts by weight | | Comparative Examples 1 | 2 | 3 |
|---|---|---|---|---|
| Bismaleimide resin (a1) | BMI-5100 | 100 | 100 | 100 |
| Cyanate ester resin (a2) | BA-230S | 200 | 200 | 200 |
| Epoxy resin (a3) | PNE-177 | 88 | | 59 |
| BZ resin (a4) | LZ-8280 | | | 50 |
| Filler (B) | 525ARI | 360 | 240 | 290 |
| Phosphorus-containing flame retardant (C) | OP-935 | 40 | 28 | 20 |
| | SPV-100 | | | 30 |
| Catalyst | Zinc | 0.1 | 0.1 | 0.1 |
| Solvent | MEK | 330 | 270 | 310 |
| Resin (a1): resin (a2): resin (a3) (based on resin solid content) | | 1:1.5:0.75 | 1:1.5:0 | 1:1.5:0.5 |
| Total amount of phosphorus atoms (wt %) | | 2.52 | 2.31 | 1.90 |

4.4.2. Preparation and Properties of Prepreg and Metal-Clad Laminate

The prepregs and metal-clad laminates were respectively prepared by using the thermal-curable resin compositions of Examples 1 to 7 and Comparative Examples 1 to 3. In detail, one of the resin compositions of Examples 1 to 7 and Comparative Examples 1 to 3 was coated on glass fiber cloths (type: 2116; thickness: 0.08 mm) by a roller at a controlled thickness. The coated glass fiber cloths were then placed in an oven and dried at 175° C. for 2 to 15 minutes to produce prepregs in a semi-cured state (B-stage) (the resin content of the prepreg was about 70%). Four pieces of the prepregs were superimposed and two sheets of copper foil (each 0.5 oz) were respectively superimposed on both of the two external surfaces of the superimposed prepregs to provide a superimposed object. A hot-pressing operation was performed on each of the prepared objects. The hot-pressing conditions were as follows: heating to about 200° C. to 220° C. at a heating rate of 3.0° C./min, and hot-pressing for 180 minutes under a full pressure of 15 kg/cm$^2$ (the initial pressure is 8 kg/cm$^2$) at said temperature.

The properties of the thermal-curable resin compositions, the prepregs and the metal-clad laminates of Examples 1 to 7 and Comparative Examples 1 to 3, including Tg, storage modulus, CTE, dynamic viscosity, solder resistance, Dk, and Df, were measured according to the aforementioned testing methods, and the results are tabulated in Tables 4 and 5.

TABLE 4

Properties of the thermal-curable resin compositions, the prepregs and the metal-clad laminates of Examples

| | Unit | Examples 1 | 2 | 3 | 4 | 5 | 6 | 7 |
|---|---|---|---|---|---|---|---|---|
| Tg | ° C. | 245 | 245 | 247 | 247 | 239 | 248 | 248 |
| Storage modulus | MPa | 9800 | 9900 | 9800 | 9700 | 9800 | 9900 | 9900 |
| CTE | % | 1.7 | 1.7 | 1.7 | 1.7 | 1.8 | 1.7 | 1.7 |
| Dynamic viscosity | Pa·s | 498 | 695 | 712 | 602 | 597 | 614 | 723 |
| Solder resistance | Number of times | >20 | >20 | >20 | >20 | >20 | >20 | >20 |
| Pressing time | Minute | 120 | 120 | 120 | 120 | 90 | 90 | 90 |
| Dk @ 10 GHz | | 3.6 | 3.6 | 3.6 | 3.6 | 3.6 | 3.6 | 3.6 |
| Df @ 10 GHz | | 0.006 | 0.0059 | 0.0059 | 0.0059 | 0.0059 | 0.0059 | 0.0059 |

TABLE 5

Properties of the thermal-curable resin compositions, the prepregs and the metal-clad laminates of Comparative Examples

|  | Unit | Comparative Examples | | |
|---|---|---|---|---|
|  |  | 1 | 2 | 3 |
| Tg | °C. | 210 | 246 | 248 |
| Storage modulus | MPa | 7900 | 12000 | 10000 |
| CTE | % | 2.2 | 1.7 | 1.7 |
| Dynamic viscosity | Pa·s | 323 | 1255 | 963 |
| Solder resistance | Number of times | 12 | >20 | >20 |
| Pressing time | Minute | 120 | 120 | 90 |
| Dk @ 10 GHz |  | 3.7 | 3.6 | 3.6 |
| Df @ 10 GHz |  | 0.0072 | 0.0059 | 0.0059 |

As shown in Table 4, each of the electronic materials prepared from the thermal-curable resin composition of the present invention exhibits satisfactory physicochemical properties and dielectric properties (e.g. Dk, Df, solder resistance, and so on), and has outstanding dimensional stability (i.e., lower CTE). Furthermore, the thermal-curable resin composition of the present invention in a semi-state has a suitable dynamic viscosity, particularly suitable for the production of multi-layer boards. In addition, as shown in Examples 5 to 7, when the thermal-curable resin composition further comprises a BZ resin, the pressing time required for the preparation of the metal-clad laminate is significantly shortened by up to 30 minutes to greatly improve overall process efficiency.

In contrast, as shown in Table 5, electronic materials prepared by using thermal-curable resin compositions other than that of the present invention cannot achieve a satisfactory level in all physicochemical properties and dielectric properties, and do not have good dimensional stability. Specifically, as shown in Comparative Example 1, when the content of the epoxy resin in the thermal-curable resin composition is excessive, although the thermal-curable resin composition may have a lower dynamic viscosity, the Df of the prepared electronic material is too high (for example, higher than 0.006) and the solder resistance thereof is poor, which is unfavorable to high frequency applications. Also, as shown in Comparative Example 2, when the thermal-curable resin composition does not contain an epoxy resin, the dynamic viscosity of the thermal-curable resin composition is too high to be suitable for the preparation of multi-layer boards. Furthermore, as shown in Comparative Example 3, when the amount of the BZ resin in the thermal-curable resin composition is too high, the dynamic viscosity of the thermal-curable resin composition is adversely increased, which is unfavorable to the preparation of multi-layer boards.

The above examples are used to illustrate the principle and efficacy of the present invention and show the inventive features thereof. People skilled in this field may proceed with a variety of modifications and replacements based on the disclosures and suggestions of the invention as described herein without departing from the principle and spirit thereof. Therefore, the scope of protection of the present invention is that as defined in the claims as appended.

What is claimed is:

1. A thermal-curable resin composition, comprising:
   (A) a thermal-curable resin component, which comprises:
   (a1) a bismaleimide resin;
   (a2) a cyanate ester resin; and
   (a3) an epoxy resin, wherein the cyanate ester resin (a2) and the epoxy resin (a3) are respectively, based on the dry weight, in an amount ranging from 75 parts by weight to 150 parts by weight and from 25 parts by weight to 50 parts by weight per 100 parts by dt weight of the bismaleimide resin (a1); and (B) a filler, wherein the cyanate ester resin (a2) is selected from the group consisting of 2,2-bis(4-cyanooxyphenyl)propane, 4,4'-ethylidene bisphenylenecyanate, 4,4'-dicyanooxybiphenyl, bis(4-cyanooxy-3,5-dimethylphenyl)methane, bis(4-cyanooxyphenyl) sulfide, bis(4-cyanooxyphenyl) ether, a prepolymer of bisphenol A dicyanate ester, 1,1-bis(4-cyanooxyphenyl) ethane, 1,1-bis(4-cyanooxyphenyl)methane, 1,3-bis(4-cyanooxyphenyl-1-(methylethylidene)) benzene, bis(4-cyanooxyphenyl)-2,2-butane, 1,3-bis[2-(4-cyanooxyphenyl)propyl]benzene, tris(4-cyanooxyphenyl)ethane, cyanated phenol, an adduct of cyanated phenol dicyclopentadiene, and combinations thereof, wherein the filler (B) is in an amount ranging from 43 parts by weight to 47 parts by weight per 100 parts by weight of the dry weight of the resin composition; and wherein the thermal-curable resin composition has a dynamic viscosity of not higher than 800 Pa·s after being brought into a semi-cured state (B-stage), and the thermal-curable resin composition has a dissipation factor (Df) of not higher than 0.006 at 10 GHz after being cured completely.

2. The thermal-curable resin composition of claim 1, wherein the bismaleimide resin (a1) has a structure represented by the following formula (I):

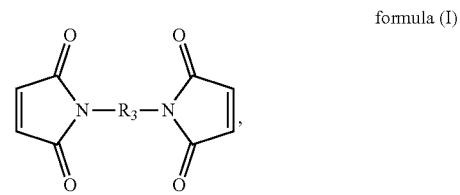

formula (I)

wherein, in formula (I), $R_3$ is selected from the group consisting of methylene (—$CH_2$—), 4,4'-diphenylmethane group

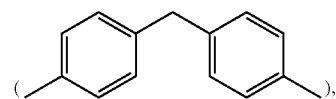

m-phenylene

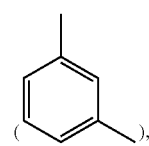

bisphenol A diphenyl ether group

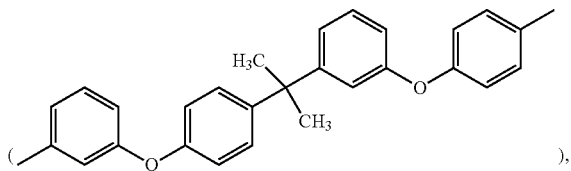

3,3'-dimethyl-5,5'-diethyl-4,4'-diphenylmethane group

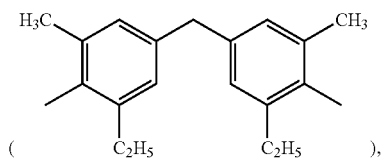

4-methyl-1,3-phenylene

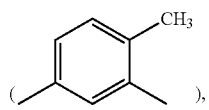

and 2,2,4-trimethyl-1,6-hexamethylene

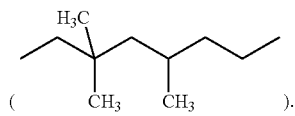

3. The thermal-curable resin composition of claim 2, wherein $R_3$ is 3,3'-dimethyl-5,5'-diethyl-4,4'-diphenylmethane group

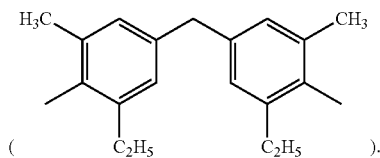

4. The thermal-curable resin composition of claim 1, wherein the cyanate ester resin (a2) is 2,2-bis(4-cyanooxyphenyl)propane.

5. The thermal-curable resin composition of claim 1, wherein the epoxy resin (a3) has at least two epoxy functional groups in each molecule.

6. The thermal-curable resin composition of claim 5, wherein the epoxy resin (a3) is selected from the group consisting of a phenol phenolic epoxy resin, a bisphenol A epoxy resin, a bisphenol F epoxy resin, a bisphenol S epoxy resin, a cresol phenolic epoxy resin, a bisphenol A phenolic epoxy resin, a bisphenol F phenolic epoxy resin, a diphenylethylene epoxy resin, a triazine skeleton-containing epoxy resin, a fluorene skeleton-containing epoxy resin, a triphenol methane epoxy resin, a biphenyl epoxy resin, a xylylene epoxy resin, a biphenyl aralkyl epoxy resin, a naphthalene epoxy resin, a dicyclopentadiene (DCPD) epoxy resin, an alicyclic epoxy resin, and combinations thereof.

7. The thermal-curable resin composition of claim 5, wherein the epoxy resin (a3) is selected from the group consisting of 1,4-butanediol diglycidyl ether, 1,6-hexanediol diglycidyl ether, (poly)ethylene glycol diglycidyl ether, (poly)propylene glycol diglycidyl ether, trimethylolethane triglycidyl ether, trimethylolpropane triglycidyl ether, 1,4-cyclohexane dimethanol diglycidyl ether, 1,2-epoxy-4-(epoxyethyl) cyclohexane, glycerol triglycidyl ether, diglycerol polydiglycidyl ether, 2,6-diglycidylphenyl glycidyl ether, 1,1,3-tris(4-glycidyloxyphenyl)propane, diglycidyl 1,2-cyclohexanedicarboxylate, 4,4'-methylenebis(N,N-diglycidylaniline), 3',4'-epoxycyclohexylmethyl 3,4-epoxycyclohexanecarboxylate, triglycidyl-p-aminophenol, tetraglycidyl-m-xylylenediamine, tetraglycidyldiaminodiphenylmethane, tetraglycidyl-1,3-bisaminomethylcyclohexane, bisphenol A diglycidyl ether, bisphenol S diglycidyl ether, tetrabromobisphenol A diglycidyl ether, hydrogenated bisphenol A diglycidyl ether, pentaerythritol diglycidyl ether, pentaerythritol tetraglycidyl ether, pentaerythritol polyglycidyl ether, resorcinol diglycidyl ether, diglycidyl phthalate, diglycidyl tetrahydrophthalate, neopentyl glycol diglycidyl ether, bisphenol hexafluoroacetone diglycidyl ether, triglycidyl isocyanurate, tris(3,4-epoxybutyl) isocyanurate, tris(4,5-epoxypentyl) isocyanurate, tris(5,6-epoxyhexyl) isocyanurate, tris(7,8-epoxyoctyl) isocyanurate, tris(2-glycidoxyethyl) isocyanurate, monoallyl diglycidyl isocyanurate, N,N'-diglycidyl-N"-(2,3-dipropionyloxypropyl)isocyanurate, tris(2,2-bis(glycidoxymethyl)butyl)-3,3',3"-(2,4,6-trioxo-1,3,5-triazine-1,3,5-triyl) tripropionate, sorbitol polyglycidyl ether, diglycidyl adipate, dibromophenyl glycidyl ether, 1,2,7,8-diepoxyoctane, 1,6-dimethylol perfluorohexane diglycidyl ether, 4-(spiro[3,4-epoxycyclohexane-1,5'-[1,3]dioxane]-2'-yl)-1,2-epoxycyclohexane, 1,2-bis(3,4-epoxycyclohexylmethoxy)ethane, 4',5'-epoxy-2'-methylcyclohexylmethyl 4,5-epoxy-2-methylcyclohexanecarboxylate, ethylene glycol bis(3,4-epoxycyclohexane carboxylate), bis(3,4-epoxycyclohexylmethyl) adipate, bis(2,3-epoxycyclopentyl) ether, and combinations thereof.

8. The thermal-curable resin composition of claim 1, wherein the filler (B) is selected from the group consisting of silicon dioxide, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like, graphite, calcined kaolin, pryan, mica, hydrotalcite, polytetrafluoroethylene (PTFE) powder, glass bead, ceramic whisker, carbon nanotube, nanosized inorganic powder, and combinations thereof.

9. The thermal-curable resin composition of claim 1, wherein the thermal-curable resin component (A) further comprises a benzoxazine resin (a4), wherein the benzoxazine resin (a4) is in an amount ranging from 3 parts by weight to 10 parts by weight per 100 parts by weight of the thermal-curable resin component (A).

10. The thermal-curable resin composition of claim 1, further comprising a phosphorus-containing flame retardant (C).

11. The thermal-curable resin composition of claim 10, wherein the phosphorus-containing flame retardant (C) is selected from the group consisting of a metal phosphinate, a diphenyl phosphine oxide (DPPO) compound, a phosphazene compound, and combinations thereof.

12. A prepreg, which is prepared by impregnating a substrate with the resin composition of claim 1 or by coating the resin composition of claim 1 onto a substrate and drying the impregnated or coated substrate.

13. A metal-clad laminate, which is prepared by laminating the prepreg of claim 12 and a metal foil.

14. A printed circuit board, which is prepared from the metal-clad laminate of claim 13.

15. A metal-clad laminate, which is prepared by coating the resin composition of claim 1 onto a metal foil and drying the coated metal foil.

16. A printed circuit board, which is prepared from the metal-clad laminate of claim 15.

* * * * *